(12) United States Patent
Chen et al.

(10) Patent No.: US 11,581,291 B2
(45) Date of Patent: Feb. 14, 2023

(54) MICRO-LED DISPLAY DEVICE AND A MANUFACTURING METHOD THEREOF

(71) Applicant: GOERTEK INC., Weifang (CN)

(72) Inventors: Peixuan Chen, Weifang (CN); Quanbo Zou, Weifang (CN); Xiangxu Feng, Weifang (CN); Tao Gan, Weifang (CN); Xiaoyang Zhang, Weifang (CN)

(73) Assignee: GOERTEK INC., Weifang (CN)

( * ) Notice: Subject to any disclaimer, the term of this patent is extended or adjusted under 35 U.S.C. 154(b) by 463 days.

(21) Appl. No.: 16/643,307

(22) PCT Filed: Jul. 24, 2017

(86) PCT No.: PCT/CN2017/094150
§ 371 (c)(1),
(2) Date: Feb. 28, 2020

(87) PCT Pub. No.: WO2019/018988
PCT Pub. Date: Jan. 31, 2019

(65) Prior Publication Data
US 2020/0219855 A1 Jul. 9, 2020

(51) Int. Cl.
*H01L 25/075* (2006.01)
*H01L 33/00* (2010.01)
(Continued)

(52) U.S. Cl.
CPC ........... *H01L 25/0753* (2013.01); *G09F 9/33* (2013.01); *H01L 21/6835* (2013.01);
(Continued)

(58) Field of Classification Search
CPC ............. H01L 25/0753; H01L 21/6835; H01L 21/7813; H01L 33/0093; H01L 33/483;
(Continued)

(56) References Cited

U.S. PATENT DOCUMENTS 9,941,262 B2 * 4/2018 Thompson .............. H01L 33/62
2017/0062650 A1 3/2017 Chen et al.
(Continued)

FOREIGN PATENT DOCUMENTS

| CN | 105518877 A | 4/2016 |
|---|---|---|
| CN | 105870265 A | 8/2016 |

(Continued)

*Primary Examiner* — Vu A Vu
(74) *Attorney, Agent, or Firm* — Saliwanchik, Lloyd & Eisenschenk

(57) ABSTRACT

A micro-LED display device and a manufacturing method thereof are disclosed. The method comprises: forming micro-LEDs (202) on a carrier substrate (201), wherein the carrier substrate (201) is transparent for a laser which is used in laser lifting-off; filling trenches between the micro-LEDs (202) on the carrier substrate (201) with a holding material (209); performing a laser lifting-off on selected ones of the micro-LEDs (202) to lift off them from the carrier substrate (201), wherein the selected micro-LEDs (202) are held on the carrier substrate (201) through the holding material (209); bonding the selected micro-LEDs (202) onto a receiving substrate (207) of the micro-LED display device; separating the selected micro-LEDs (202) from the carrier substrate (201) to transfer them to the receiving substrate (207).

8 Claims, 4 Drawing Sheets

(51) Int. Cl.
  *G09F 9/33*   (2006.01)
  *H01L 21/683*  (2006.01)
  *H01L 21/78*  (2006.01)
  *H01L 33/48*  (2010.01)

(52) U.S. Cl.
  CPC ...... *H01L 21/7813* (2013.01); *H01L 33/0093* (2020.05); *H01L 33/483* (2013.01); *H01L 2221/68381* (2013.01); *H01L 2933/0033* (2013.01)

(58) Field of Classification Search
  CPC ... H01L 2221/68381; H01L 2933/0033; H01L 33/0095; H01L 2224/95; H01L 25/167; H01L 33/486; G09F 9/33
  USPC ........................................................ 438/125
  See application file for complete search history.

(56) References Cited

U.S. PATENT DOCUMENTS

| | | |
|---|---|---|
| 2017/0278734 A1 | 9/2017 | Zou et al. |
| 2018/0053751 A1 | 2/2018 | Zou et al. |

FOREIGN PATENT DOCUMENTS

| | | |
|---|---|---|
| CN | 106057723 A | 10/2016 |
| CN | 106170849 A | 11/2016 |
| CN | 106486569 A | 3/2017 |
| KR | 20150074321 A | 7/2015 |

\* cited by examiner

MICRO-LED DISPLAY DEVICE AND A MANUFACTURING METHOD THEREOF

CROSS REFERENCE TO RELATED APPLICATIONS

This application is a National Stage of International Application No. PCT/CN2017/094150, filed on Jul. 24, 2017, which is hereby incorporated by reference in its entirety.

FIELD OF THE INVENTION

The present invention relates to the technical field of micro-LED display, and more specifically, to a method for manufacturing a micro-LED display device and a micro-LED display device.

BACKGROUND OF THE INVENTION

The micro-LED technology refers to the LED array of small size integrated on a substrate with high density. As the development of micro-LED technology, it is expected in the industry that a high-quality micro-LED product would come into the market. High quality micro-LED will have a deep impact on the conventional display products such as LCD/OLED that have already been in the market.

In the process of manufacturing micro-LEDs, a micro-LED array is first formed on a carrier substrate. The carrier substrate can be a growth substrate or an intermediate substrate. Then, the micro-LED array is transferred to a receiving substrate of a display device. The receiving substrate can be a display screen or display panel, etc. The display device can be used in an electronic apparatus, such as a micro-display in an argument reality device or a virtual reality device, a watch, a mobile phone a television and so on.

In the prior art, the micro-LED array can be transferred from one substrate to another substrate through laser lifting-off (LLO). FIG. 1 shows a prior art transfer process of micro-LED from a carrier substrate to a receiving substrate of a display device through laser lifting-off.

As shown in FIG. 1, micro-LEDs 102 are formed on a carrier substrate 101. The micro-LEDs 102 may have P-metal on top. For example, the carrier substrate 101 can be a sapphire substrate. Generally, blue or green micro-LEDs can grow on the sapphire substrate 101, and red micro-LEDs can be transferred from a GaAs substrate to the sapphire substrate 101. In this case, the laser for lifting-off may have wavelength around 248 nm. Optionally, the carrier substrate 101 can be a GaAs substrate, and red micro-LEDs can grow on it. In this situation, the laser for lifting-off may have wavelength around 1064 nm.

The micro-LEDs 102 are bonded on a receiving substrate 107 via micro-bumps 103. The micro-bumps 103 are placed on electrodes 104, such as anodes on top of a TFT circuitry layer 106. For example, the TFT circuitry layer 106 is covered by a polymide layer 105 to protect the TFT circuit. The micro-bumps 103 are separated by the polyimide layer 105.

Laser 108 is irradiated on the selected micro-LEDs 102 from the side of the carrier substrate 101 to perform a laser lifting-off.

As shown in FIG. 1, the inventors have found that there is a risk of crack 109 in the micro-LEDs 102 under laser lifting-off. The crack of a micro-LED is related to the inhomogeneous strain distribution on the micro-LED during the laser lifting-off. The inhomogeneous strain on micro-LED may be ascribed to the rough surface of a receiving substrate of a display device, the misalignment between the micro-LED substrate and the micro-bumps on the receiving substrate and so on. The crack will cause a yield loss at transfer.

Therefore, there is a demand in the art that a new solution for transferring micro-LEDs during manufacturing a micro-LED display device shall be proposed to address at least one of the problems in the prior art.

SUMMARY OF THE INVENTION

One object of this invention is to provide a new technical solution for transferring micro-LEDs during manufacturing a micro-LED display device.

According to a first aspect of the present invention, there is provided a method for manufacturing a micro-LED display device, comprising: forming micro-LEDs on a carrier substrate, wherein the carrier substrate is transparent for a laser which is used in laser lifting-off; filling trenches between the micro-LEDs on the carrier substrate with a holding material; performing a laser lifting-off on selected ones of the micro-LEDs to lift off them from the carrier substrate, wherein the selected micro-LEDs are held on the carrier substrate through the holding material; bonding the selected micro-LEDs onto a receiving substrate of the micro-LED display device; and separating the selected micro-LEDs from the carrier substrate to transfer them to the receiving substrate.

Alternatively or optionally, the method further comprises: reducing thickness of the holding material to be lower than that of the micro-LEDs before performing the laser lifting-off.

Alternatively or optionally, the carrier substrate is a sapphire substrate, and the micro-LEDs are blue micro-LEDs or green micro-LEDs.

Alternatively or optionally, the carrier substrate is a GaAs substrate, and the micro-LEDs are red micro-LEDs.

Alternatively or optionally, the holding material includes at least one of photoresist, glue, polymer, silicone, or grease.

Alternatively or optionally, the selected micro-LEDs are separated from the carrier substrate by heating the holding material.

Alternatively or optionally, the holding material is photoresist and is removed after bonding the selected micro-LEDs onto a receiving substrate.

Alternatively or optionally, the selected micro-LEDs are separated from the carrier substrate with removing the holding material and with separating the carrier substrate from the receiving substrate.

Alternatively or optionally, the selected micro-LEDs are separated from the carrier substrate with assistance of heating and then cooling the carrier substrate and the receiving substrate.

Alternatively or optionally, the holding material is photoresist and is removed after bonding the selected micro-LEDs onto a receiving substrate.

Alternatively or optionally, the selected micro-LEDs are separated from the carrier substrate by removing the holding material.

According to a second aspect of the present invention, there is provided a micro-LED display device, which is manufactured by using the method for manufacturing a micro-LED display device according to any embodiment.

According to an embodiment of this disclosure, cracks of micro-LEDs during transfer can be reduced.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
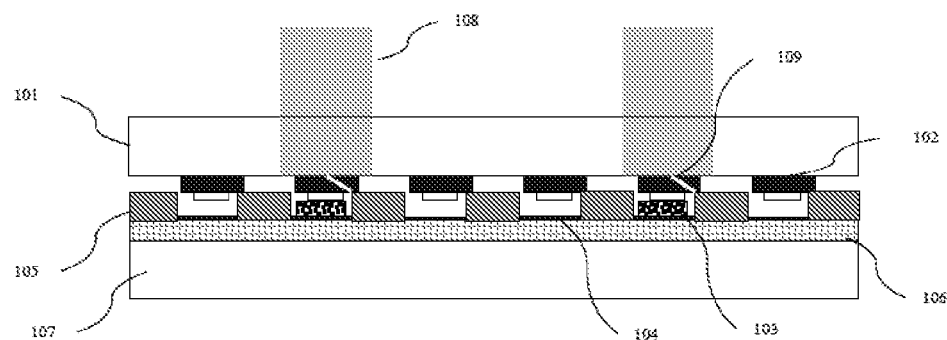
FIG. 1 schematically shows a prior art laser lifting-off process.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples will be described with reference to the figures. It will be appreciated by a person skilled in the art that the following description will focus on the features different from the prior art. So, the processes which are not described or are not described in detail in this description can be carried out in a prior art manner.

FIGS. 2-6 schematically show a process of transferring micro-LEDs according to a first embodiment.

Figure 2:
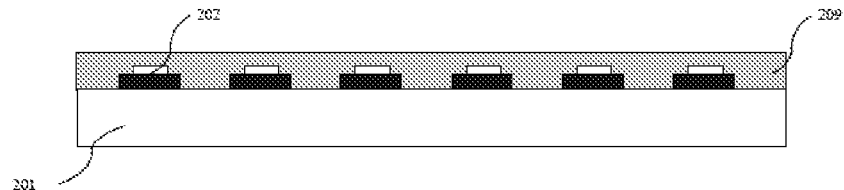
FIGS. 2-6 schematically show a process of transferring micro-LEDs according to a first embodiment.

As shown in FIG. 2, micro-LEDs 202 are formed on a carrier substrate 201. The carrier substrate 202 is transparent for a laser which is used in laser lifting-off. For example, the laser may have a wavelength around 248 nm. The carrier substrate can be a sapphire substrate, and the micro-LEDs are blue micro-LEDs or green micro-LEDs. Alternatively, red micro-LEDs can be transferred from a growth substrate to the carrier substrate 201 in advance. In another example, the laser may have a wavelength around 1064 nm. The carrier substrate 201 can be a GaAs substrate and red micro-LEDs may grown on the substrate.

In FIG. 2, trenches between the micro-LEDs 202 on the carrier substrate 201 are filled with a holding material 209.

The holding material 209 will temporarily hold the micro-LEDs after a laser lifting-off. For example, the holding material may include at least one of photoresist, glue, polymer, silicone, or grease.

For example, in a case where the holding material 209 is photoresist, the photoresist can be spun on the micro-LEDs 202 and the carrier substrate 201.

Figure 3:
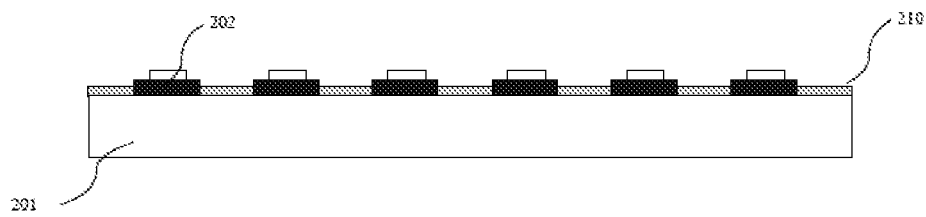

In FIG. 3, the thickness of the holding material 210 is reduced so that it is suitable for being bonded with a receiving substrate.

Figure 4:
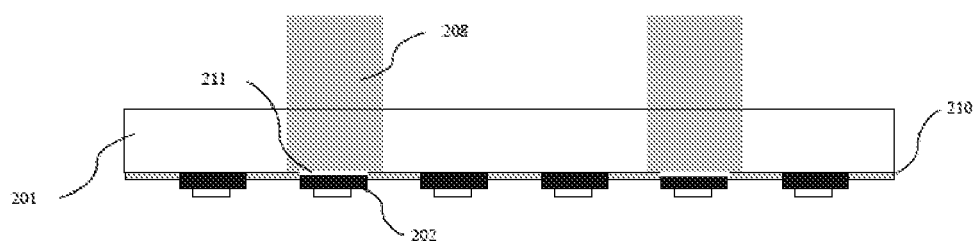

In FIG. 4, a laser lifting-off is performed on selected ones of the micro-LEDs 202 to lift off them from the carrier substrate 201. The selected micro-LEDs 202 are held on the carrier substrate 201 through the holding material 210.

Here, the holding material will relax certain strain during the laser lifting-off. Because of more homogeneous strain distribution on micro-LEDs during laser lifting-off, the micro-LEDs will have less crack loss. The influence on the micro-LED from a rough receiving substrate or a misalignment between the micro-LEDs and the micro-bumps on the receiving substrate may be eliminated.

Thus, there will be a less crack loss during laser lifting-off. Therefore, a higher transfer yield from a carrier substrate to a receiving substrate may be achieved.

It can be seen from FIG. 4, a laser 208 is irradiated from the side of the carrier substrate 201. The laser may have a wavelength around 248 nm for a sapphire substrate or a wavelength around 1064 nm for a GaAs substrate. As indicated by the reference sign 211, the selected micro-LEDs 202 are lifted off.

Figure 5:
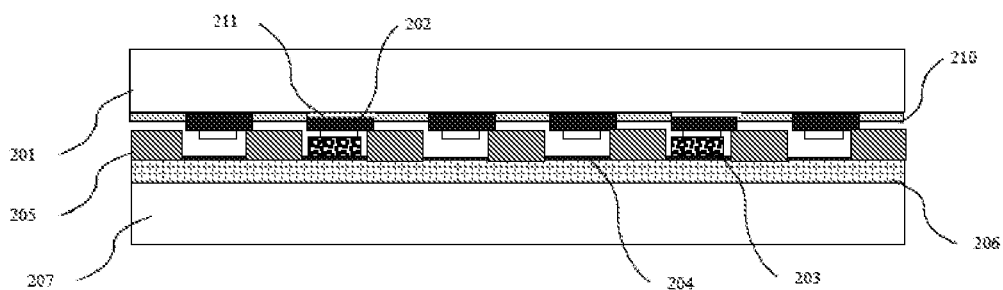

As shown in FIG. 5, the selected micro-LEDs 202 are bonded onto a receiving substrate 207 of the micro-LED display device (not shown).

For example, the micro-LEDs 202 are bonded with electrodes 204 via micro-bumps 203. The electrodes 204 are on top of a thin film transistor (TFT) circuitry layer 206 of the receiving substrate 207. The material of the micro-bump includes, but not limited to, In, Sn, other metals, alloys, or electrical conductive adhesives or resists. The micro-bumps 203 are separated by a polyimide layer 205.

Figure 6:
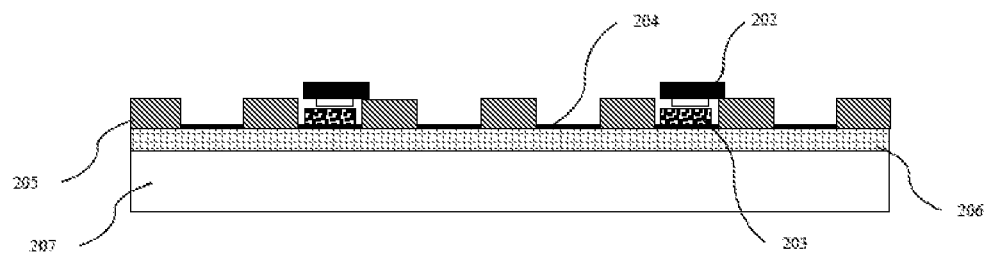

As shown in FIG. 6, the holding material 210 is photoresist and will be removed after bonding the selected micro-LEDs 202 onto the receiving substrate 207. In an example, the selected micro-LEDs 202 are separated from the carrier substrate 207 with removing the photoresist 210 and with separating the carrier substrate 201 from the receiving substrate 207.

In a case where the holding material is photoresist, it can be removed by acetone, resist strip and so on. Furthermore, the photoresist can be removed before or after separation of the micro-LEDs 202 from the carrier substrate 201.

For example, the selected micro-LEDs 202 are transferred from the carrier substrate 201 to the receiving substrate 207. For example, the selected micro-LEDs 202 are separated from the carrier substrate 201 by heating and then cooling the carrier substrate 201 and the receiving substrate 207. The holding material 210, micro-LEDs 202, and carrier substrate 201, receiving substrate 207 have different thermal expansion coefficient, thus the micro-LEDs 202 may be separated easily.

In the above embodiment, the thickness of the holding material 209/210 is reduced to be lower than that of the micro-LEDs before performing the laser lifting-off. In the second embodiment, the thickness of the holding material will be reduced to be lower than that of the micro-LEDs after performing the laser lifting-off. FIGS. 7-11 schematically show a process of transferring micro-LEDs according to a second embodiment. The portions of the second embodiment similar with the first embodiment may be omitted.

Figure 7:
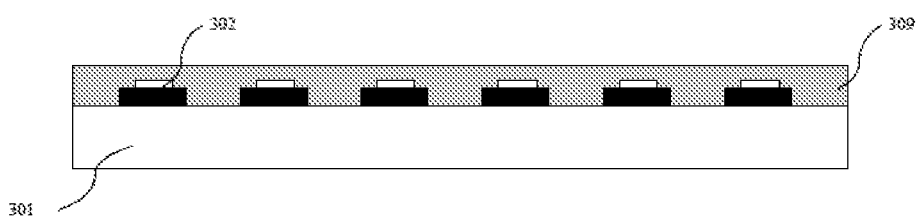
FIGS. 7-11 schematically show a process of transferring micro-LEDs according to a second embodiment.

As shown in FIG. 7, micro-LEDs 302 are formed on a carrier substrate 301. Trenches between the micro-LEDs 302 on the carrier substrate 301 are filled with a holding material 309. Thickness of holding material 309 is larger than that of micro-LEDs 302.

Figure 8:
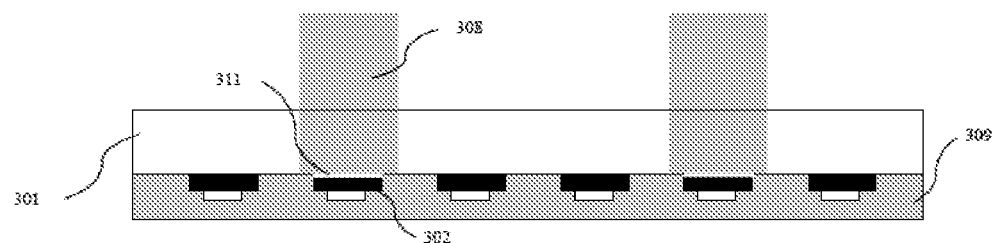

In FIG. 8, a laser lifting-off is performed on selected ones of the micro-LEDs 302 to lift off them from the carrier substrate 301. The selected micro-LEDs 302 are held on the carrier substrate 301 through the holding material 309. It can be seen from FIG. 8, a laser 308 is irradiated from the side of the carrier substrate 301. As indicated by the reference sign 311, the selected micro-LEDs 302 are lifted off.

Figure 9:
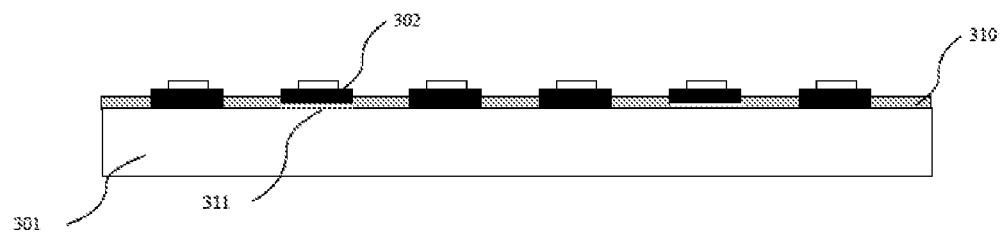

In FIG. 9, the thickness of the holding material 310 is reduced so that it is suitable for being bonded with a receiving substrate.

Figure 10:
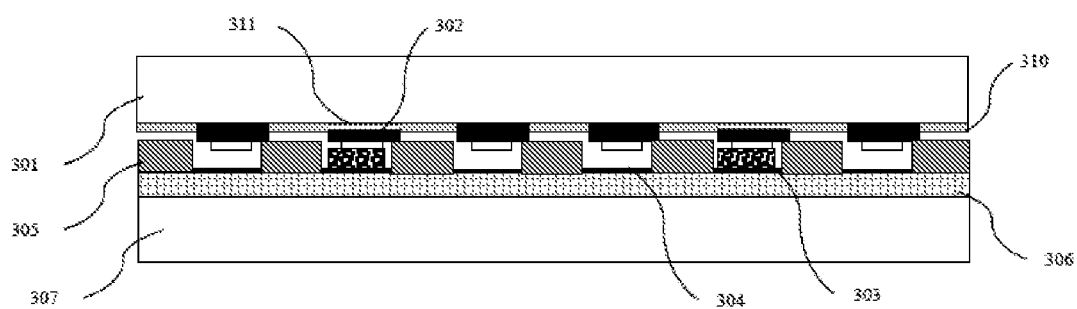

As shown in FIG. 10, the selected micro-LEDs 302 are bonded onto a receiving substrate 307 of the micro-LED display device (not shown). For example, the micro-LEDs 302 are bonded with electrodes 304 via micro-bumps 303. The electrodes 304 are on top of a thin film transistor (TFT) circuitry layer 306 of the receiving substrate 307. The micro-bumps 303 are separated by a polyimide layer 305

Figure 11:
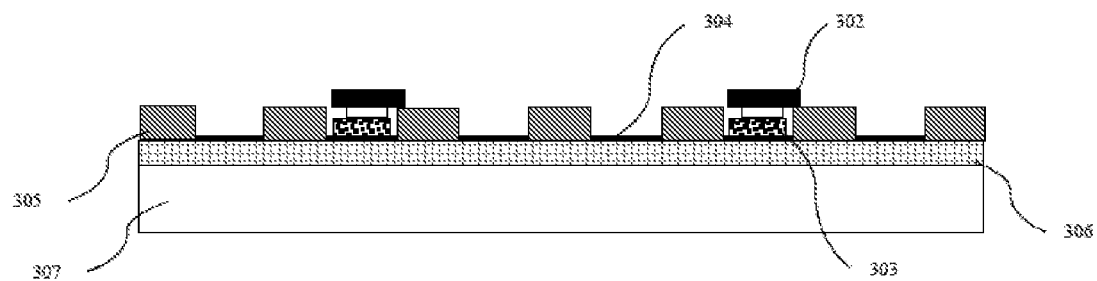

As shown in FIG. 11, the selected micro-LEDs 302 are separated from the carrier substrate 301 to transfer them to the receiving substrate 307.

The above micro-LED transfer process can be adopted in a process of manufacturing a micro-LED display device. For example, the process of manufacturing a micro-LED display device includes transferring micro-LEDs from a carrier substrate to a receiving substrate of the display device by using the above micro-LED transfer process. The display device may a display screen or display panel, for example.

The micro-LED display device manufactured as such can be used in a micro-display in an argument reality device or a virtual reality device, a watch, a mobile phone a television and so on.

Figure 12:
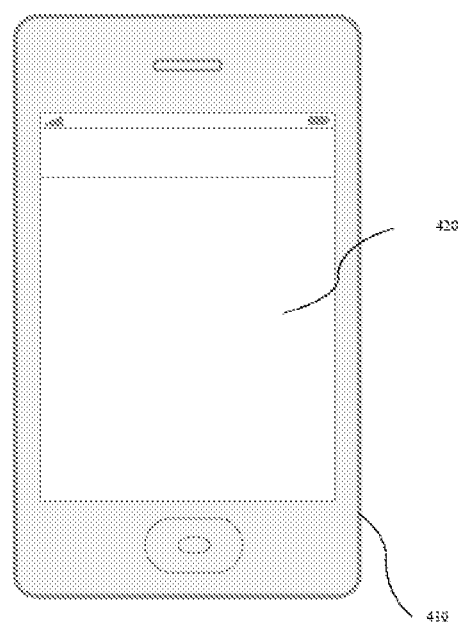
FIG. 12 schematically shows an electronic apparatus which can use a micro-LED display device manufactured according to an embodiment of this disclosure.

FIG. 12 schematically shows an electronic apparatus which can use a micro-LED display device manufactured according to an embodiment of this disclosure. As shown in FIG. 12, the electronic apparatus 410 includes a display device 420, which can display information to a user. The display device 420 may be a micro-LED display device manufactured as above.

Although some specific embodiments of the present invention have been demonstrated in detail with examples, it should be understood by a person skilled in the art that the above examples are only intended to be illustrative but not to limit the scope of the present invention.

What is claimed is:

1. A method for manufacturing a micro-LED display device, comprising:
    forming micro-LEDs on a carrier substrate, wherein the carrier substrate is transparent for a laser which is used in laser lifting-off;
    filling trenches between the micro-LEDs on the carrier substrate with a holding material;
    performing a laser lifting-off on selected ones of the micro-LEDs to lift off them from the carrier substrate, wherein the selected micro-LEDs are held on the carrier substrate through the holding material;
    bonding the selected micro-LEDs onto a receiving substrate of the micro-LED display device;
    separating the selected micro-LEDs from the carrier substrate to transfer them to the receiving substrate, and
    reducing thickness of the holding material to be lower than that of the micro-LEDs before or after performing the laser lifting-off.

2. The method according to claim 1, wherein the carrier substrate is a sapphire substrate, and the micro-LEDs are blue micro-LEDs or green micro-LEDs.

3. The method according to claim 1, wherein the carrier substrate is a GaAs substrate, and the micro-LEDs are red micro-LEDs.

4. The method according to claim 1, wherein the holding material includes at least one of photoresist, glue, polymer, silicone, or grease.

5. The method according to claim 1, wherein the holding material is photoresist and is removed after bonding the selected micro-LEDs onto a receiving substrate.

6. The method according to claim 5, wherein the selected micro-LEDs are separated from the carrier substrate with removing the holding material and with separating the carrier substrate from the receiving substrate.

7. The method according to claim 1, wherein the selected micro-LEDs are separated from the carrier substrate with assistance of heating and then cooling the carrier substrate and the receiving substrate.

8. A micro-LED display device, which is manufactured by using the method for manufacturing a micro-LED display device according to claim 1.

* * * * *